(12) United States Patent
Nakagawa et al.

(10) Patent No.: US 9,892,949 B2
(45) Date of Patent: Feb. 13, 2018

(54) IMPRINT METHOD, IMPRINT APPARATUS, AND ARTICLE MANUFACTURING METHOD

(71) Applicant: CANON KABUSHIKI KAISHA, Tokyo (JP)

(72) Inventors: Kazuki Nakagawa, Utsunomiya (JP); Noriyasu Hasegawa, Utsunomiya (JP); Yosuke Murakami, Utsunomiya (JP); Takahiro Matsumoto, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/372,515

(22) Filed: Dec. 8, 2016

(65) Prior Publication Data

US 2017/0092524 A1 Mar. 30, 2017

Related U.S. Application Data

(63) Continuation of application No. 14/887,472, filed on Oct. 20, 2015, now Pat. No. 9,566,741, which is a
(Continued)

(30) Foreign Application Priority Data

Oct. 14, 2011 (JP) .................................. 2011-226636
Oct. 2, 2012 (JP) .................................. 2012-220209

(51) Int. Cl.
*B41L 35/14* (2006.01)
*H01L 21/68* (2006.01)
(Continued)

(52) U.S. Cl.
CPC ........ *H01L 21/682* (2013.01); *B29C 35/0805* (2013.01); *B29C 59/026* (2013.01);
(Continued)

(58) Field of Classification Search
CPC ........................ H01L 21/6368; H01L 21/6838
(Continued)

(56) References Cited

U.S. PATENT DOCUMENTS 4,561,688 A 12/1985 Tsutsui
5,772,905 A 6/1998 Chou
(Continued)

FOREIGN PATENT DOCUMENTS

CN 102203671 A 9/2011
JP 55-32022 A 3/1980
(Continued)

OTHER PUBLICATIONS

Chinese Official Action dated Jan. 30, 2014, issued in corresponding Chinese Patent Application No. 20120285057.9, with an English translation.
(Continued)

*Primary Examiner* — Anthony Nguyen
(74) *Attorney, Agent, or Firm* — Fitzpatrick, Cella, Harper & Scinto

(57) ABSTRACT

An imprint apparatus forms a pattern of an imprint material on a substrate by using a mold. A substrate holding unit holds the substrate by a suction force between the substrate and a holding surface and includes a first suction unit for sucking a rear surface of a first region of the substrate with a first suction force and a second suction unit for sucking a rear surface of a second region of the substrate with a second suction force. A deformation mechanism deforms a shape of the first region in a direction along the holding surface when forming the pattern of the imprint material on the first region. An adjusting unit adjusts the first and second suction forces. The first suction force is less than the second in at least a portion of a period during the deforming of the shape of the first region by the deformation mechanism.

18 Claims, 7 Drawing Sheets

Related U.S. Application Data continuation of application No. 13/647,667, filed on Oct. 9, 2012, now Pat. No. 9,201,298.

(51) Int. Cl.

| | | |
|---|---|---|
| *G03F 7/00* | (2006.01) | |
| *B82Y 10/00* | (2011.01) | |
| *B82Y 40/00* | (2011.01) | |
| *B29C 59/02* | (2006.01) | |
| *B29C 59/16* | (2006.01) | |
| *B29C 35/08* | (2006.01) | |
| *H01L 21/027* | (2006.01) | |
| *H01L 21/324* | (2006.01) | |
| *H01L 21/67* | (2006.01) | |
| *H01L 21/683* | (2006.01) | |
| *H01L 21/66* | (2006.01) | |
| *H01L 23/544* | (2006.01) | |
| *B29K 101/00* | (2006.01) | |
| *B29L 9/00* | (2006.01) | |
| *B29L 31/34* | (2006.01) | |

(52) U.S. Cl.
CPC ............ *B29C 59/16* (2013.01); *B82Y 10/00* (2013.01); *B82Y 40/00* (2013.01); *G03F 7/0002* (2013.01); *H01L 21/0271* (2013.01); *H01L 21/324* (2013.01); *H01L 21/6715* (2013.01); *H01L 21/67115* (2013.01); *H01L 21/6838* (2013.01); *H01L 22/20* (2013.01); *H01L 23/544* (2013.01); *B29C 2035/0822* (2013.01); *B29K 2101/00* (2013.01); *B29L 2009/00* (2013.01); *B29L 2031/34* (2013.01)

(58) Field of Classification Search
USPC ........................................................ 101/488
See application file for complete search history.

(56) References Cited

U.S. PATENT DOCUMENTS

| | | | |
|---|---|---|---|
| 6,350,071 B1 | 2/2002 | Conwell et al. | |
| 6,805,054 B1 | 10/2004 | Meissl et al. | |
| 6,892,769 B2 | 5/2005 | Hong | |
| 7,170,589 B2 | 1/2007 | Cherala et al. | |
| 7,271,950 B1 | 9/2007 | Gordon et al. | |
| 7,298,456 B2 | 11/2007 | Cherala et al. | |
| 7,322,287 B2 | 1/2008 | Tan et al. | |
| 7,360,851 B1 | 4/2008 | Snyder | |
| 7,420,654 B2 | 9/2008 | Cherala et al. | |
| 7,540,079 B2 | 6/2009 | Okuyama et al. | |
| 7,641,468 B2 | 1/2010 | Wu et al. | |
| 7,648,354 B2 * | 1/2010 | Kokubo ................. G11B 7/265 425/174.4 |
| 7,785,533 B2 | 8/2010 | Fujita et al. | |
| 7,920,296 B2 | 4/2011 | Beato et al. | |
| 8,205,551 B2 | 6/2012 | Begon et al. | |
| 8,309,008 B2 | 11/2012 | Choi et al. | |
| 8,318,074 B2 | 11/2012 | Kokubo et al. | |
| 8,336,456 B2 | 12/2012 | Bietsch et al. | |
| 8,652,393 B2 | 2/2014 | Khusnatdinov et al. | |
| 8,820,236 B2 | 9/2014 | Beier et al. | |
| 9,244,342 B2 | 1/2016 | Sato | |
| 9,372,396 B2 | 6/2016 | Kruijt-Stegeman et al. | |
| 9,387,607 B2 | 7/2016 | Matsumoto et al. | |
| 2005/0018122 A1 | 1/2005 | Hong | |
| 2005/0089597 A1* | 4/2005 | Ito ........................... B29C 43/36 425/388 |
| 2005/0235851 A1 | 10/2005 | Beier et al. | |
| 2005/0270516 A1 | 12/2005 | Cherala et al. | |
| 2006/0131260 A1 | 6/2006 | Okuyama et al. | |
| 2007/0048179 A1 | 3/2007 | Fujita et al. | |
| 2007/0048444 A1* | 3/2007 | Watanabe ............. B29C 43/021 427/162 |
| 2007/0164476 A1 | 7/2007 | Wu et al. | |
| 2009/0153925 A1 | 6/2009 | Beato et al. | |
| 2010/0059904 A1* | 3/2010 | Kasumi ................. B29C 59/022 264/293 |
| 2010/0096774 A1 | 4/2010 | Kruijt-Stegeman et al. | |
| 2011/0147969 A1 | 6/2011 | Song | |
| 2011/0215490 A1* | 9/2011 | Fujii ....................... B29C 39/006 264/1.1 |
| 2011/0273684 A1 | 11/2011 | Owa et al. | |
| 2013/0093113 A1 | 4/2013 | Hayashi et al. | |
| 2015/0290846 A1 | 10/2015 | Matsumoto et al. | |

FOREIGN PATENT DOCUMENTS

| | | |
|---|---|---|
| JP | 56-80141 A | 7/1981 |
| JP | S59-46030 A | 3/1984 |
| JP | 2004-259985 A | 9/2004 |
| JP | 2007-083626 A | 4/2007 |
| JP | 2008-504141 A | 2/2008 |
| JP | 2010-098310 A | 4/2010 |
| JP | 2010-517300 A | 5/2010 |
| KR | 10-2011-0069730 A | 6/2011 |
| KR | 10-2011-0072738 A | 6/2011 |
| WO | 2009/153925 A1 | 12/2009 |

OTHER PUBLICATIONS

Korean Notice of Preliminary Rejection dated Feb. 12, 2016, issued in corresponding Korean Patent Application No. 10-2016-0009949, with an English translation.

Japanese Official Action dated Mar. 29, 2016, issued in corresponding Japanese Patent Application No. 2012-220209, with an English translation.

Japanese Official Action dated Oct. 25, 2016, issued in corresponding Japanese Patent Application No. 2012-220209, with an English translation.

\* cited by examiner

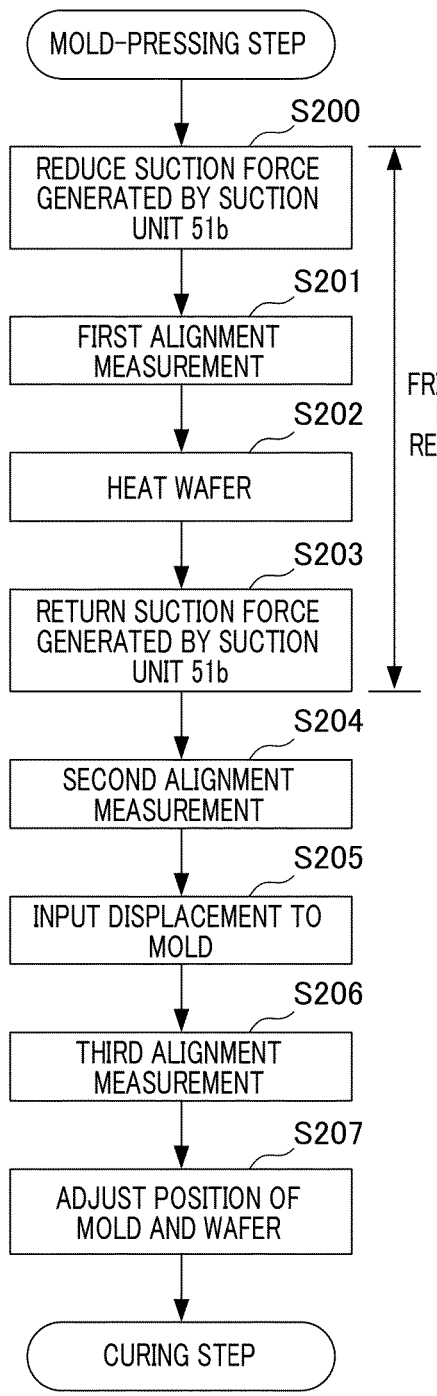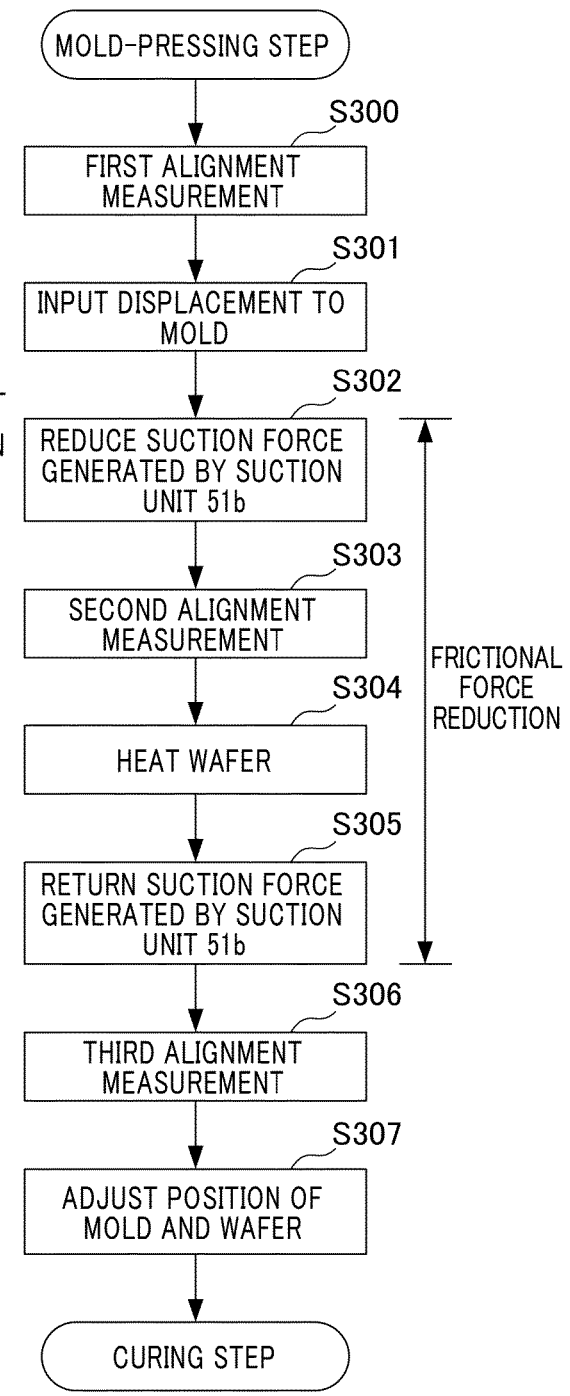

IMPRINT METHOD, IMPRINT APPARATUS, AND ARTICLE MANUFACTURING METHOD

This application is a continuation of copending U.S. patent application Ser. No. 14/887,472, filed Oct. 20, 2015, which is a continuation of U.S. patent application Ser. No. 13/647,667, filed Oct. 9, 2012, which matured into U.S. Pat. No. 9,201,298.

This application also claims the benefit of Japanese Patent Application No. 2011-226636, filed Oct. 14, 2011, and Japanese Patent Application No. 2012-220209, filed Oct. 2, 2012, which are hereby incorporated by reference herein in their entirety.

BACKGROUND OF THE INVENTION

Field of the Invention

The present invention relates to an imprint method, an imprint apparatus, and an article manufacturing method.

Description of the Related Art

As the demand for microfabrication of semiconductor devices or MEMS increases, not only has conventional photolithography technology, but also, microfabrication technology, in which an uncured resin on a substrate is molded by a mold to thereby form a resin pattern on the substrate, has been receiving attention. This technology is also referred to as "imprint technology", by which a fine structure with dimensions of a few nanometers can be formed on a substrate. One example of the imprint technology includes a photo-curing method. An imprint apparatus employing the photo-curing method first applies an ultraviolet curable resin (imprint material, photocurable resin) to a shot (imprint region) on a substrate (wafer). Next, the resin (uncured resin) is molded by a mold. After the ultraviolet curable resin is irradiated with ultraviolet light for curing, the cured resin is released from the mold, whereby a resin pattern is formed on the substrate.

Here, in a series of device manufacturing steps, heat processing in a film formation step, such as sputtering, is performed for a substrate to be subjected to imprint processing. Consequently, the entire substrate may be expanded or reduced, resulting in a change in the shape (size) of the pattern in the direction of two orthogonal in-plane axes. Thus, in an imprint apparatus, the shape of the substrate-side pattern formed on a substrate needs to be matched with the shape of the pattern section formed on a mold when the mold is pressed against the resin on the substrate. In a conventional exposure apparatus, such shape correction (magnification correction) can be ensured by changing the size of each shot during exposure processing by changing the reduction magnification of a projection optical system in accordance with the magnification of the substrate or by changing the scanning speed of a substrate stage. However, the imprint apparatus does not have a projection optical system and the mold is brought into direct contact with the resin on the substrate, and thus, it is difficult to perform such correction. Hence, the imprint apparatus employs a shape correction mechanism (magnification correction mechanism) that physically deforms a mold by imparting an external force to the sides of the mold or by expanding the mold by heating.

For example, assume a case wherein the imprint apparatus is applied to a manufacturing step of manufacturing a semiconductor device having a half-pitch of about 32 nm. At this time, according to ITRS (International Technology Roadmap for Semiconductors), the superposition accuracy is 6.4 nm. In order to accommodate this, shape correction also needs to be performed with an accuracy of a few nm or less. On the other hand, the mold (pattern section) used in the imprint apparatus may also be distorted by the following causes. For example, the pattern surface of a mold is directed upward when the mold is being prepared, whereas the pattern surface thereof is directed downward when the mold is used (during pressing). Thus, the pattern section may be deformed upon usage under the influence of gravity. Although the pattern section is typically formed by a drawing apparatus using an electron beam, or the like, the pattern section may also be distorted due to distortion aberration of the optical system of the drawing apparatus during formation thereof. Furthermore, even if the pattern section can be prepared without distortion, the occurrence of distortion in a substrate-side pattern may result in an adverse effect on the superposition accuracy. Accordingly, in order to suppress such distortion (deformation) of the mold and to improve superposition accuracy, Japanese Patent Laid-Open No. 2004-259985 discloses a pattern forming apparatus that controls the temperature of a mold and a substrate by means of a retention temperature control unit, and corrects the shape of the mold or the substrate by generating desired thermal deformation in the mold or the substrate.

In the conventional imprint apparatus, however, a substrate is held by a substrate holding unit, such as a wafer chuck, with the bottom surface of the substrate restricted thereto. Thus, even if thermal deformation is generated on the substrate under temperature control disclosed in Japanese Patent Laid-Open No. 2004-259985, it is still difficult to sufficiently change the shape of the substrate-side pattern relative to the shape of the pattern section. Accordingly, an imprint apparatus is desired that is capable of improving superposition accuracy between a mold and a resin on a substrate by readily implementing not only the correction of the shape of the mold, but also, the correction of the shape of the substrate (including the substrate-side pattern) relative to the shape of the mold.

SUMMARY OF THE INVENTION

The present invention provides an imprint apparatus that is advantageous for improving superposition accuracy between a mold and resin on a substrate.

According to one aspect, the present invention provides an imprint apparatus for forming a pattern of an imprint material on a substrate by using a mold that includes a substrate holding unit configured to hold the substrate by acting a suction force between the substrate and a holding surface, the substrate holding unit including a first suction unit for sucking a rear surface of a first region of the substrate with a first suction force and a second suction unit for sucking a rear surface of a second region of the substrate different from the first region of the substrate with a second suction force, a deformation mechanism configured to deform a shape of the first region in a direction along the holding surface when forming the pattern of the imprint material on the first region, and an adjusting unit configured to adjust the first suction force and the second suction force. The adjusting unit adjusts the first suction force to be less than the second force in at least a portion of a period during the deforming of the shape of the first region by the deformation mechanism.

According to another aspect, the present invention provides a method of manufacturing an article including the steps of (a) forming a pattern of an imprint material on a substrate using an imprint apparatus for forming the pattern on the substrate by using a mold, (b) processing the substrate on which the pattern is formed by the forming, and (c) manufacturing the article from the processed substrate. The imprint apparatus includes (i) a substrate holding unit configured to hold the substrate by acting as a suction force between the substrate and a holding surface, the substrate holding unit including a first suction unit for sucking a rear surface of a first region of the substrate with a first suction force and a second suction unit for sucking a rear surface of a second region of the substrate different from the first region of the substrate with a second suction force, (ii) a deformation mechanism configured to deform a shape of the first region in a direction along the holding surface when forming the pattern of the imprint material on the first region, and (iii) an adjusting unit configured to adjust the first suction force and the second suction force. The adjusting unit adjusts the first suction force to be less than the second force in at least a portion of a period during the deforming of the shape of the first region by the deformation mechanism.

Further features of the present invention will become apparent from the following description of exemplary embodiments with reference to the attached drawings.

BRIEF DESCRIPTION OF THE DRAWINGS

FIG. 4A is a flowchart illustrating the sequence of operations according to a second embodiment.

FIG. 4B is a flowchart illustrating a variant example of the sequence of operations shown in FIG. 4A.

DESCRIPTION OF THE EMBODIMENTS

Hereafter, preferred embodiments of the present invention will be described with reference to the accompanying drawings.

(First Embodiment)

Figure 1:
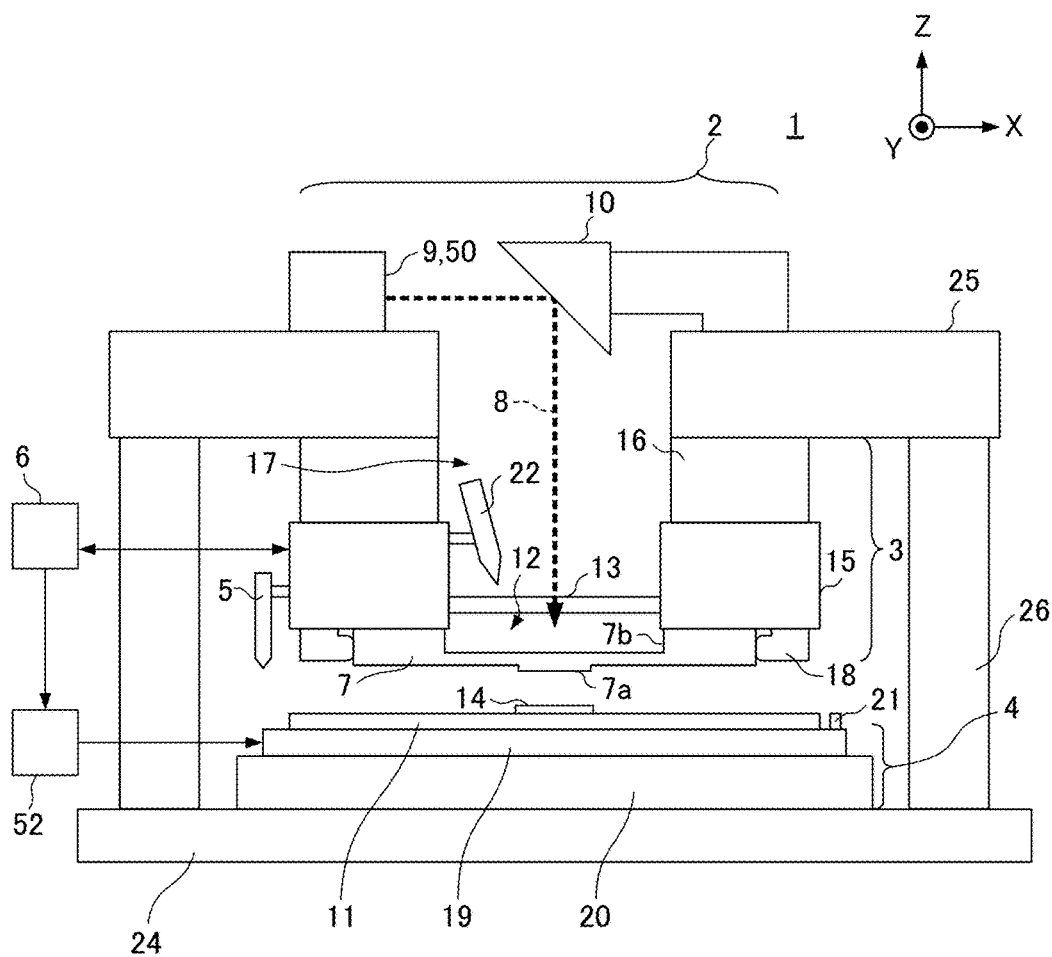
FIG. 1 is a diagram illustrating the configuration of an imprint apparatus according to a first embodiment of the present invention.

First, a description will be given of the configuration of an imprint apparatus according to a first embodiment of the present invention. FIG. 1 is a schematic diagram illustrating the configuration of an imprint apparatus 1 of the present embodiment. The imprint apparatus 1 is an apparatus that molds an uncured resin on a wafer (on a substrate), i.e., a substrate to be treated, using a mold, to thereby form a resin pattern on the wafer, which is used in the manufacture of devices, such as semiconductor devices, and the like, as articles. Note that the imprint apparatus of the present embodiment is an apparatus employing a photo-curing method. In the following drawings, a description will be given in which the Z axis is aligned parallel to the optical axis of an irradiation system that irradiates a resin on a wafer with ultraviolet light, and mutually orthogonal axes, X and Y, are aligned in a plane perpendicular to the Z axis. The imprint apparatus 1 includes a light irradiation unit 2, a mold holding mechanism 3, a wafer stage 4, an application unit 5, and a control unit 6.

The light irradiation unit 2 irradiates a mold 7 with ultraviolet light 8 during imprint processing. The light irradiation unit 2 is constituted by a light source 9 and an optical element 10 that adjusts the ultraviolet light 8 emitted from the light source 9 to light suitable for imprinting. Note that, in the present embodiment, the light irradiation unit 2 is installed for employing a photo-curing method. If, however, a thermosetting method is employed, a heat source unit for curing a thermosetting resin may be installed, instead of the light irradiation unit 2. Furthermore, the light irradiation unit 2 includes a heating light source 50 that functions as a heating mechanism (substrate deformation mechanism) for heating a wafer 11 by irradiating the wafer 11 with light in addition to light from the light source 9. The light irradiated by the heating light source 50 is light near the wavelength range of infrared light, to which a photocurable resin is not sensitive. The heating mechanism also includes an adjuster that forms a predetermined irradiation dose distribution of light. In the present embodiment, a description will be given on the assumption that the heating light source 50 is integrated with the adjuster. Note that the adjuster may be provided separately from the heating light source 50. For example, a liquid crystal device including a plurality of liquid crystal elements arranged in a region irradiated with light emitted from the heating light source 50 or a mirror device, including a plurality of mirrors arranged in a region irradiated with light, may also be used. Here, the mirror device may also be referred to as a "digital mirror device" or a "micro mirror device". The liquid crystal device is capable of forming a predetermined irradiation dose distribution by independently adjusting voltages to be applied to a plurality of liquid crystal elements, whereas the mirror device is capable of forming a predetermined irradiation dose distribution by independently adjusting the surface directions of a plurality of mirrors.

The outer peripheral shape of the mold 7 is rectangular, and the mold 7 includes a pattern section (e.g., a circuit pattern, or the like) 71, in which the concave and convex pattern is three-dimensionally formed on the surface of the facing wafer 11. Also, the material of the mold 7 is a material such as quartz, or the like, through which the ultraviolet light 8 can pass. Furthermore, the mold 7 may be of a shape in which a cavity (concave portion) 7b for facilitating the deformation of the mold 7 is formed on the surface onto which the ultraviolet light 8 is irradiated. The cavity 7b has a circular planar shape, and the thickness (depth) of the cavity 7b is appropriately set, depending on the size or the material of the mold 7. A light transmission member 13 may also be installed within an aperture region 17 in the mold holding mechanism 3, to be described below, such that a space 12 enclosed by a part of the aperture region 17 and the cavity 7b is sealed, and the pressure in the space 12 may be adjusted by a pressure adjusting device (not shown). For example, the pressure adjusting device sets the pressure in the space 12 to be higher than the external pressure when the mold 17 is pressed against a resin 14 on the wafer 11, so that the pattern section 7a is deflected into a convex shape toward the wafer 11, and the pattern section 7a is brought into contact with the resin 14 from the central portion of the pattern section 7a. With this arrangement, gas (air) is prevented from being entrapped between the pattern section 7a and the resin 14, so that the resin 14 can be filled in every corner of the convex and concave portion of the pattern section 7a.

The mold holding mechanism 3 has a mold chuck 15 that holds the mold 7 by suctioning/attracting the mold 7 using a vacuum suction force/and an electrostatic attraction force, and a mold drive mechanism 16 that holds the mold chuck 15 and moves the mold 7 (the mold chuck 15). Also, each of the mold chuck 15 and the mold drive mechanism 16 has the aperture region 17 at the central portion (the inside thereof), such that the ultraviolet light 8, emitted from the light source 9 of the light irradiation unit 2, is irradiated toward the wafer 11. Furthermore, the mold holding mechanism 3 has a magnification correction mechanism (mold deformation mechanism) 18 that corrects the shape of the mold 7 (the pattern section 7a) by imparting an external force or a displacement to the side surface of the mold 7. The magnification correction mechanism 18 is installed at the mold 7 holding side of the mold chuck 15. The magnification correction mechanism 18 deforms the shape of the mold 7, to thereby match the shape of the pattern section 7a formed on the mold 7 relative to the shape of the area on the substrate (substrate-side pattern area) 53 where the pre-existing pattern is formed. If it is difficult to match the shape of the pattern section 7a relative to the shape of the substrate-side pattern area 53, the magnification correction mechanism 18 may also be adapted to make the shapes of both patterns close to each other (i.e., to reduce a shape differential between the two). While the one substrate-side pattern area 53 is shown in the figure, a plurality of substrate-side pattern areas are formed on the wafer 11.

The mold drive mechanism 16 moves the mold 7 in the Z-axis direction so as to relatively bring the mold 7 into contact with the resin 14 on the wafer 11, or to release the mold 7 from the resin 14. Examples of an actuator employable for the mold drive mechanism 16 include a linear motor, an air cylinder, and the like. Also, the mold drive mechanism 16 may be constituted by a plurality of drive systems, such as a coarse movement drive system, a fine movement drive system, and the like, in order to accommodate position of the mold 7 with high accuracy. Furthermore, the mold drive mechanism 16 may have a position adjustment function for adjusting the position of the mold 7, not only in the Z-axis direction, but also, in the X-axis direction, the Y-axis direction, or the θ (rotation about the Z axis) direction, a tilt function for correcting the tilt of the mold 7, and the like. The contacting operation and the releasing operation performed by the imprint apparatus 1 may be realized by moving the mold 7 in the Z-axis direction, may be realized by moving the wafer stage 4 in the Z-axis direction, or may also be realized by moving both the mold 7 and the wafer stage 4 relative to each other.

The wafer 11 is, for example, a single crystal silicon substrate or an SOI (Silicon on Insulator) substrate, and an ultraviolet curable resin (hereafter referred to as "resin") 14, which is molded by the pattern section 7a formed in the mold 7, is applied on the treatment surface of the wafer 11.

The wafer stage 4 holds the wafer 11 and executes position matching between the mold 7 and the resin 14 before, or while the mold 7 is brought into contact with the resin 14 on the wafer 11. The wafer stage 4 has a wafer chuck (substrate holding unit) 19, on which a holding surface for holding the wafer 11 is formed, and a stage drive mechanism 20 that holds the wafer chuck 19 by a mechanical unit and is movable in the XY plane.

Figure 2:
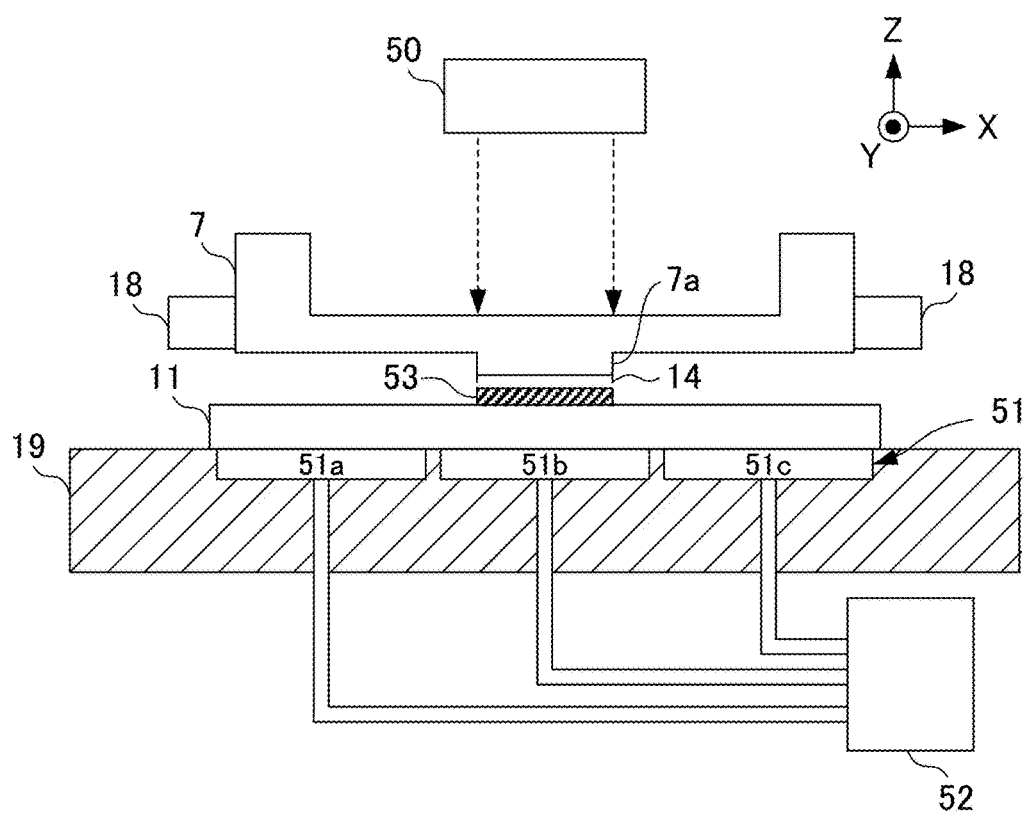
FIG. 2 is a diagram illustrating the configuration of a wafer stage according to the first embodiment.

FIG. 2 is a schematic cross-sectional diagram illustrating the wafer chuck 19 of the present embodiment and the configuration of the peripheral portion thereof. The wafer chuck 19 includes a plurality of suction units 51 that holds the rear surface of the wafer 11 by suction. As shown in FIG. 2, the suction units 51 may be constituted by, for example, three suction units 51a to 51c. These suction units 51a to 51c are connected to a pressure adjusting device 52 separate from the aforementioned pressure adjusting device, and function as a frictional force adjusting mechanism that adjusts the frictional force acting between the rear surface of the wafer 11 corresponding to a region including the substrate-side pattern area 53 and the surface of the wafer chuck 19. The pressure adjusting device 52 adjusts the pressure to reduce the pressure between the wafer 11 and the suction units 51, to thereby generate a suction force. Consequently, the pressure adjusting device 52 is capable of independently changing pressure values (suction forces) applied by the suction units 51a to 51c, while holding the wafer 11 on the surface of the wafer chuck 19. Note that the number of divided suction units 51 is not limited to three, but may be any number. Also, the wafer chuck 19 has a reference mark 21 that is used when the mold 7 is subjected to alignment on the surface thereof.

Examples of an actuator employable for the stage drive mechanism 20 include a linear motor. The stage drive mechanism 20 may also be constituted by a plurality of drive systems, such as a coarse movement drive system, a fine movement drive system, and the like, with respect to the X-axis and Y-axis directions. Furthermore, the stage drive mechanism 20 may have a drive system for adjusting the position of the wafer 11 in the Z-axis direction, a position adjustment function for adjusting the position of the wafer 11 in the θ direction, a tilt function for correcting the tile of the wafer 11, and the like.

The application unit 5 applies the resin (uncured resin) 14 to the wafer 11. Here, the resin 14 is a photocurable resin (imprint material) having the property of being cured by receiving irradiation of the ultraviolet light 8, and is appropriately selected depending on various conditions, such as the manufacturing process of semiconductor devices, or the like. The amount of the resin 14 to be ejected from the ejection nozzle of the application unit 5 is also appropriately determined by a desired thickness of the resin 14 to be formed on the wafer 11, the density of the pattern to be formed, or the like.

The control unit 6 may control the operation, adjustment, and the like, of the components of the imprint apparatus 1. The control unit 6 is constituted by a computer, or the like, and is connected to the components of the imprint apparatus 1 through a line so as to execute control of the components by a program, or the like. The control unit 6 of the present embodiment may control the operation of at least the light irradiation unit 2, the wafer stage 4, and the pressure adjusting device 52. Note that the control unit 6 may be integrated with the rest of the imprint apparatus 1 (provided in a common housing) or may be provided separately from the rest of the imprint apparatus 1 (provided in a separate housing).

Also, the imprint apparatus 1 includes an alignment measurement system 22 that measures a positional shift between an alignment mark formed on the wafer 11 and an alignment mark formed on the mold 7 in each direction of the X-axis and the Y-axis as wafer alignment. Furthermore, the imprint apparatus 1 includes a base surface plate 24, on which the wafer stage 4 is placed, a bridge surface plate 25 that fixes the mold holding mechanism 3, and a strut 26 that is extended from the base surface plate 24, and supports the bridge surface plate 25. Furthermore, the imprint apparatus 1 includes a mold conveyance mechanism (not shown) that conveys the mold 7 from the exterior of the apparatus to the mold holding mechanism 3 and a substrate conveyance mechanism (not shown) that conveys the wafer 11 from the exterior of the apparatus to the wafer stage 4.

Next, a description will be given of imprint processing performed by the imprint apparatus 1. First, the control unit 6 places the wafer 11 on the wafer chuck 19 of the wafer stage 4 using the substrate conveyance mechanism, holds the wafer 11 on the holding surface of the wafer chuck 19 (holding step), and then moves the wafer stage 4 to the application position of the application unit 5. Then, as an application step, the application unit 5 applies the resin 14 to the substrate-side pattern area (a shot area) 53. Next, the control unit 6 moves the wafer stage 4 such that the substrate-side pattern area 53 on the wafer 11 is placed in a position directly below the pattern section 7a formed in the mold 7. Next, the control unit 6 drives the mold drive mechanism 16 so as to press the mold 7 against the resin 14 on the wafer 11 (mold-pressing step) so that the mold 7 is brought into contact with the resin 14 (contacting step). During the contacting step, the resin 14 is filled in the convex and the concave pattern of the pattern section 7a. Under this condition, as a curing step, the light irradiation unit 2 emits the ultraviolet light 8 from the rear surface (the top surface) of the mold 7, and cures the resin 14 by the ultraviolet light 8 that has been transmitted through the mold 7. Then, after the resin 14 is cured, the control unit 6 drives the mold drive mechanism 16 again, to thereby release the mold 7 from the resin 14 (mold-releasing step). By the aforementioned steps, a three-dimensionally shaped pattern (layer) of the resin 14 following the convex and concave pattern of the pattern section 7a is formed on the surface of the substrate-side pattern area 53 on the wafer 11. Such a sequence of imprint operations is conducted two or more times, while the substrate-side pattern area 53 is changed under the drive of the wafer stage 4, to thereby be able to form a plurality of patterns of the resin 14 on one wafer 11.

Figure 3:
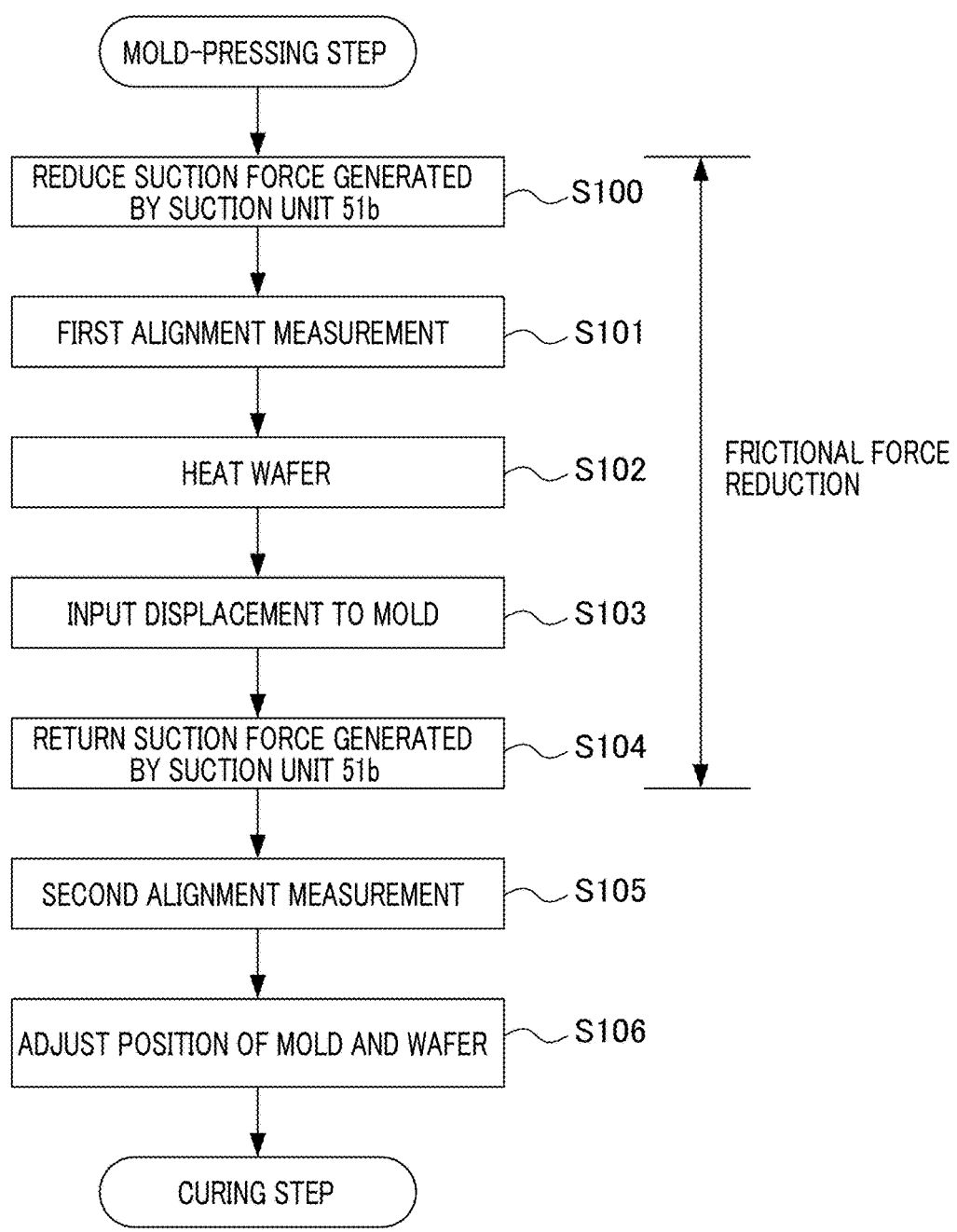
FIG. 3 is a flowchart illustrating the sequence of operations according to the first embodiment.

Here, a description will be given of the suction control by means of the wafer chuck 19 when a pattern is formed on the wafer 11 for a predetermined shot. FIG. 3 is a flowchart illustrating the sequence of operations from the mold-processing step to the curing step performed by the imprint apparatus 1. At this time, a shot to be processed is located at the central portion of the wafer 11, and, as shown in FIG. 2, the position is intended to correspond to the suction unit 51b provided in the wafer chuck 19. In this case, the control unit 6 causes the pressure adjusting device 52 to reduce only the suction force generated by the suction unit 51b, while maintaining the suction force generated by the suction units 51a and 51c prior to the correction of the shape of the pattern section 7a and the wafer 11 (step S 100). For example, the suction pressure of the suction unit 51b may be ambient pressure. If the suction pressure of the suction unit 51b is less than the suction force generated by the suction units 51a and 51c, the suction pressure of the suction unit 51b may be ambient pressure or less. When the adjusting range of the irradiation dose of light emitted from the heating light source 50 is set in advance, the suction pressure of the suction unit 51b may be set such that the thermal deformation force W acting o the substrate-side pattern area 53 in a direction along the surface of the wafer 11 is greater than the maximum static frictional force F acting between the rear surface of the wafer 11 and the suction unit 51b. When the temperature rise of the substrate-side pattern area 53 is give as "$\Delta T$", the thermal expansion coefficient thereof is given as "$\alpha$", and the modulus of elasticity thereof is given as "E", all of which are determined depending on the irradiation dose, the thermal stress "$\sigma$" can be approximately expressed as the products of $\alpha$, E, and $\Delta T$. The thermal deformation force W, depending on the thermal stress "$\sigma$" and the cross-sectional area "S", acts on the substrate-side pattern area 53. When the maximum static frictional coefficient is given as "$\mu$" and the vertical direction depending on the suction pressure is given as "N", the maximum static frictional force F can be expressed as the product of $\mu$ and N. In other words, it is only necessary to satisfy the relationship of F<W. Note that the region on the wafer 11 held by the suction unit 51b may be a region including at least the substrate-side pattern area 53 where the pattern is preformed on the wafer 11. Next, the control unit 6 causes the alignment measurement system 22 to measure the positions of the mold 7 and the wafer 11 in the X-axis and the Y-axis directions (first alignment measurement, step S101), and acquires information regarding differences between the shape of the pattern section 7a and the shape of the substrate-side pattern area 53 (acquiring step). However, when it is desired to correct only the shape of the substrate-side pattern area 53 formed on the wafer 11, the control unit 6 may acquire only information regarding the shape of the substrate-side pattern area 53. Then, the control unit 6 calculates the correction amount to a positional shift between the pattern section 7a and the substrate-side pattern area 53 based on the measurement result obtained in step S101. Next, the control unit 6 causes the heating light source 50 of the light irradiation unit 2 to heat the wafer 11 by irradiating the wafer 11 with light (deformation step: step S102), and causes the magnification correction mechanism 18 to operate for inputting displacement (mold-deformation step: step S103), and thus, the shapes of the pattern section 7a and the substrate side pattern area 53 are corrected. Since the maximum static frictional force acting between the rear surface of the wafer 11 corresponding to the substrate-side pattern area 53 and the holding surface is reduced, as described above, the thermal deformation force greater than the maximum static frictional force F can be applied to the wafer 11 in a direction along the surface thereof. Also, a temperature distribution is imparted to the substrate-side pattern area 53 by irradiating the substrate-side pattern area 53 with light having an irradiation dose distribution, whereby the shape of various components can be corrected. For example, among the calculated correction amount, a low-order component (e.g., a trapezoidal component) is corrected by heating the wafer 11 and a high-order component is corrected by displacement input, whereby the shape of the pattern section 7a can be preferably matched with the shape of the substrate-side pattern area 53. When the shape of the pattern section 7a is matched with the shape of the substrate-side pattern area 53, as a result of correction, the control unit 6 causes the pressure adjusting device 52 to reduce the suction pressure of the suction unit 51b again, so as to return the suction force generated by the suction unit 51b back to the level of the suction force generated by the suction units 51a and 51c (step S104). Next, the control unit 6 causes the alignment measurement system 22 to measure the positions of the mold 7 and the wafer 11, again, in the X-axis and the Y-axis directions (second alignment measurement: step S105). Here, if it is determined that a positional shift is present between the mold 7 and the wafer 11, the control unit 6 causes the mold drive mechanism 16 or the stage drive mechanism 20 to drive, to perform position adjustment between the mold 7 and the wafer 11 (step S106). Then, the control unit 6 proceeds to the next process in the curing step.

The step of reducing the suction force generated by the suction unit 51b in step S100 may be started, not only prior to the first alignment measurement in step S101, but also, after the first alignment measurement. It is preferable that the step of reducing the suction force generated by the suction unit 51b is performed prior to or during the deforming step of heating a substrate. In step S102, the correction of the shape of the substrate-side pattern area 53 on the wafer 11 is performed by heating due to the irradiation of light from the heating light source 50, but the present invention is not limited thereto. For example, in a substrate deformation mechanism, instead of the heating light source 50, a separately provided external force applying mechanism may impart an external force or input displacement in a planar direction directly to the wafer 11, to thereby perform the correction of the shape of the substrate-side pattern area 53. Furthermore, the shape of the substrate-side pattern area 53 may be matched with the shape of the pattern section 7a by performing shape correction only due to the heating of the wafer 11 in step S102, without performing the displacement input to the mold 7 in step S103. Note that steps S102 and step S103 may be performed inversely or in parallel. Also, it is preferable that the step of recovering the suction force generated by the suction unit 51b is performed after the deforming step, and prior to the mold-releasing step.

As described above, in the imprint apparatus 1, the suction force generated by the suction unit 51b is reduced during a period from the mold-pressing step to the curing step, to thereby reduce a frictional force between the suction unit 51b and the rear surface of the wafer 11, including at least the substrate-side pattern area 53. Specifically, during the thermal deformation of the substrate-side pattern area 53 by the heating light source 50 of the light irradiation unit 2, a frictional force acting between the wafer chuck 19 and the rear surface of the wafer 11, corresponding to the substrate-side pattern area 53, is reduced more than when the substrate-side pattern area 53 is not subjected to thermal deformation. Thus, the substrate-side pattern area 53 can be efficiently deformed by heating. In other words, the substrate-side pattern area 53 can be deformed by heating without an unnecessary increase in irradiation dose, and thus, an unnecessary rise in temperature of the peripheral members can be suppressed. Consequently, the adverse effect on superposition accuracy between the mold 7, and the resin 14 on the wafer 11, can be suppressed. Furthermore, at this time, the suction force generated by other suction units 51a and 51c remains maintained. Consequently, the wafer 11 is firmly fixed on the wafer chuck 19 by suction, even if the wafer 11 is subjected to thermal deformation, and thus, displacement of the entire wafer 11 is suppressed. There is no need to reduce a frictional force at all times during thermal deformation, but a frictional force may be reduced in at least a portion of the period during thermal deformation.

As described above, according to the present embodiment, the imprint apparatus 1, which is advantageous for improving superposition accuracy between the mold 7 and the resin 14 on the wafer 11, may be provided.

(Second Embodiment)

Next, a description will be given of an imprint apparatus according to a second embodiment of the present invention. The imprint apparatus of the present embodiment has the same configuration as that of the first embodiment, but the sequence of operations from the mold-pressing step to the curing step is changed. FIGS. 4A and 4B are flowcharts illustrating the sequence of operations from the mold-pressing step to the curing step performed by the imprint apparatus 1 according to the present embodiment. First, in the example shown in FIG. 4A, after the mold-pressing step, the control unit 6 causes the magnification correction mechanism 18 to perform the displacement input to the mold 7 in step S 103, in the sequence of operations of the first embodiment shown in FIG. 3, after the second alignment measurement in step S105 (step S205). Here, given that the alignment measurement in step S201 is the first alignment measurement, a step corresponding to a step S105, shown in FIG. 3, is the second alignment measurement shown in FIG. 4A (step S204). In this case, the control unit 6 causes the alignment measurement system 22 to perform the third alignment measurement the same as the second alignment measurement, again, after step S205 (step S206). Note that the third alignment measurement may be omitted by using the value obtained by the second alignment measurement. The processes in other steps are the same as those in the first embodiment.

On the other hand, in the example shown in FIG. 4B, after the mold-pressing step, the control unit 6 causes the magnification correction mechanism 18 to perform the displacement input to the mold 7 in step S103 in the sequence of operations of the first embodiment shown in FIG. 3, prior to the process of reducing the suction force generated by the suction unit 51b in step S100 (step S301). In this case, the control unit 6 causes the alignment measurement system 22 to perform the first alignment measurement, which is a process corresponding to step S101 shown in FIG. 3, prior to step S301 (step S300). Also, the control unit 6 starts the process of reducing the suction force generated by the suction unit 51b, which corresponds to step S100 shown in FIG. 3, after step S301 (step S302). Then, after step S304, corresponding to step S102 shown in FIG. 3, which is the correction of the shape of the substrate-side pattern area 53 on the wafer 11, the control unit 6 raises the suction force generated by the suction unit 51b again (step S305). The processes in the other steps are the same as those in the first embodiment. According to the present embodiment, as shown in FIGS. 4A and 4B, the displacement input to the mold 7 by means of the magnification correction mechanism 18 is not performed while a frictional force is being reduced. Thus, the same effects as those in the first embodiment may be provided. In addition, unnecessary positional shift or unnecessary deformation of the wafer 11, in association with deformation of the mold 7 upon inputting of displacement, can be further suppressed.

(Third Embodiment)

Figure 5:
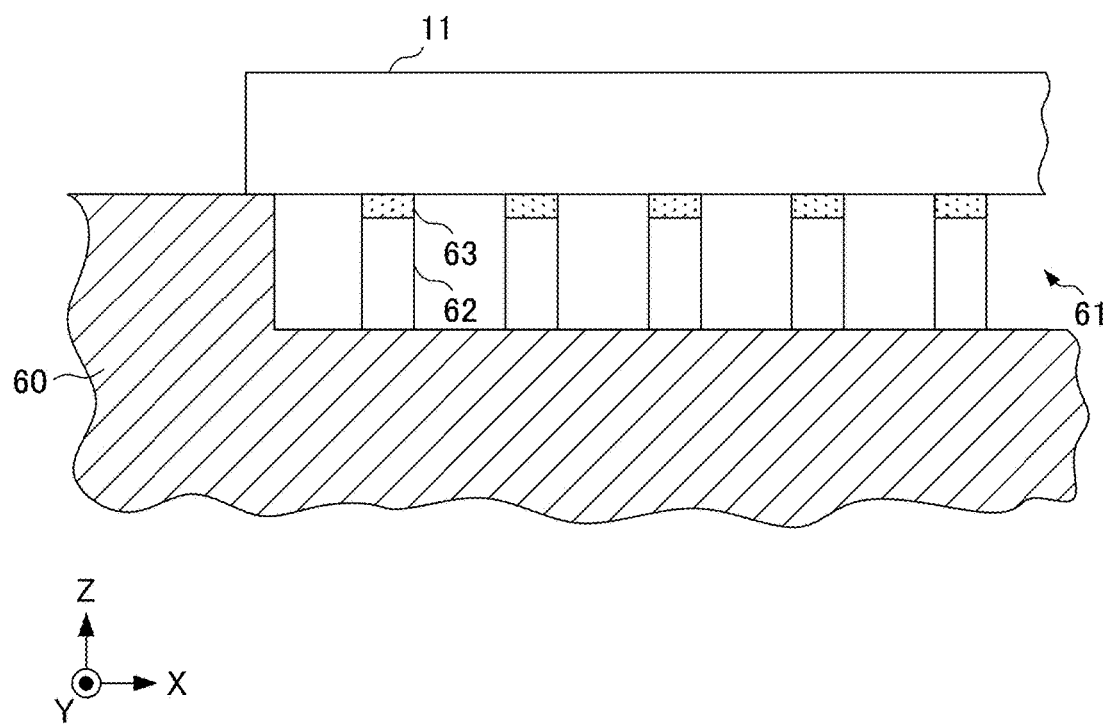
FIG. 5 is a diagram illustrating the configuration of a wafer stage according to a third embodiment.

Next, a description will be given of an input apparatus according to a third embodiment of the present invention. In the imprint apparatus of the present embodiment, the configuration of the suction units 51 provided in the wafer chuck 19 according to the first embodiment is changed. FIG. 5 is a schematic cross-sectional diagram illustrating an enlarged portion of the suction unit 51 (51a) provided in the wafer chuck 19 according to the present embodiment. The suction unit 51 has a plurality of suction pins 60 within the suction region, and a low-friction member 61 made of a low-friction material having a low friction coefficient against the wafer 11 is provided at the tip surface of each suction pin 60, i.e., the surface in contact with the rear surface of the wafer 11. Examples of such a low-friction material include DLC (diamond-like carbon). As described above, a frictional coefficient of the contact surface between the wafer chuck 19 and the wafer 11 is reduced, and thus, the wafer 11 (the substrate-side pattern area 53) can be efficiently deformed by heating with the heating light source 50 of the light irradiation unit 2.

(Fourth Embodiment)

Next, a description will be given of an imprint apparatus according to a fourth embodiment of the present invention. In the imprint apparatus of the first embodiment, a description has been given by taking an example in which a frictional force, acting between the rear surface of the wafer 11 corresponding to the substrate-side pattern area 53 and the holding surface of the wafer chuck 19, is adjusted. In the present embodiment, a description will be given taking an example in which a thermal deformation force acting on the substrate-side pattern area 53 is adjusted, without adjusting the friction force. Since the configuration of the imprint apparatus of the present embodiment is the same as that of the first embodiment, except that the control unit 6 is different in terms of function, a description of the configuration thereof will be omitted, while focusing on the function of the control unit 6.

Figure 6:
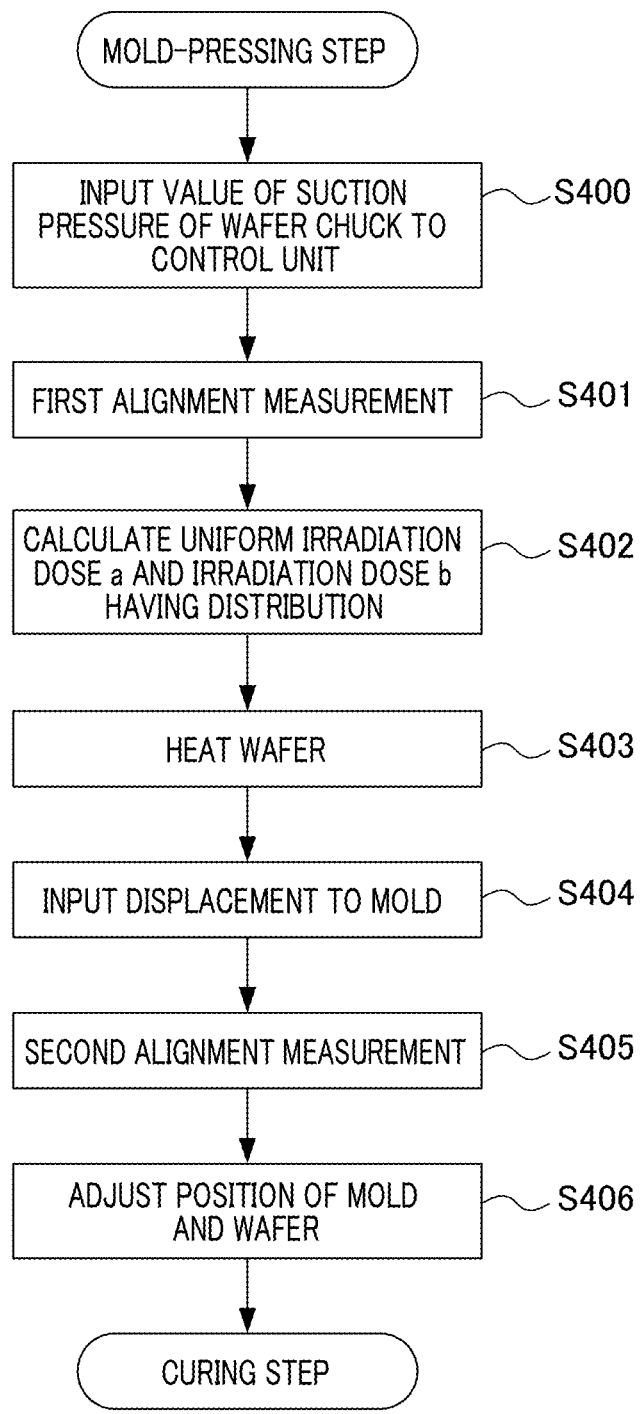
FIG. 6 is a flowchart illustrating the sequence of operations according to a fourth embodiment.

FIG. 6 is a flowchart illustrating the sequence of operations from the mold-pressing step to the curing step performed by the imprint apparatus 1 of the present embodiment. First, the control unit 6 reads the value of the suction pressure of the suction unit 51b provided in the wafer chuck 19 after the mold-pressing step (step S400). Next, the control unit 6 orders to perform first alignment measurement corresponding to the process in step S101 shown in FIG. 3 (step S401). The control unit 6 calculates the irradiation dose of light irradiated on a wafer, based on the value of the suction pressure of the suction unit 51b obtained in step S400 (step S402). Next, the shape of the substrate-side pattern area 543 is corrected by irradiating the wafer 11 with the calculated irradiation dose of light (step S403). Then, the displacement input to the mold 7 (step S404 corresponding to step S103 shown in FIG. 3) and the second alignment measurement (step S405 corresponding to step S105 shown in FIG. 3) are executed. When a positional shift is present between the mold 7 and the wafer 11, position adjustment between the mold 7 and the wafer 11 (step S406) is performed. Then, the curing step is performed.

Figure 7:
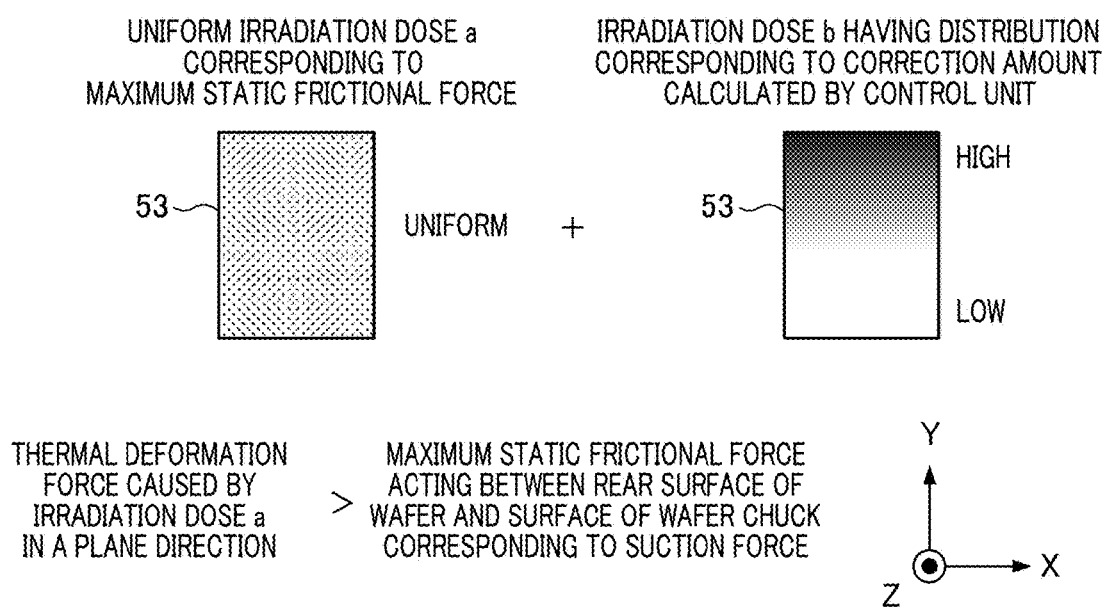
FIG. 7 is a diagram illustrating the irradiation dose of light according to the fourth embodiment.

A description will be given of an irradiation dose to be calculated in step S402, with reference to FIG. 7. The heating mechanism irradiates the irradiation region on the wafer 11, including at least the substrate-side pattern area 53 with light obtained as the sum of a uniform irradiation dose a and an irradiation dose b having a distribution. Here, the irradiation dose a is a uniform irradiation dose with respect to an irradiation region, in which a thermal deformation force applied to the irradiation region on the wafer 11 in a direction along the plane thereof is greater than the maximum static frictional force acting between the rear surface of the irradiation region on the wafer 11 and the suction unit 51. The irradiation dose b is an irradiation dose having a distribution with respect to an irradiation region depending on the correction amount of the substrate-side pattern area 53 calculated by the control unit 6, or depending on the value obtained by subtracting the amount of deformation of the wafer 11 caused by the irradiation dose a from the correction amount.

It is preferable that the irradiation dose a is determined depending on the suction pressure of the suction unit 51b (suction force). When the temperature rise of the substrate-side pattern area 53 is given as "$\Delta T$", the thermal expansion coefficient thereof is given as "$\alpha$", and the modulus of elasticity thereof is given as "E", all of which are determined depending on the irradiation dose. The thermal stress "$\sigma$" can be approximately expressed as the product of $\alpha$, E, and $\Delta T$. The thermal deformation force W depending on the thermal stress "$\sigma$" and the cross-sectional area "S" acts on the substrate-side pattern area 53. When the maximum static frictional coefficient is given as "$\mu$" and the vertical directional force depending on the suction pressure is given as "N", the maximum static frictional force F can be expressed as the product of $\mu$ and N. In other words, it is only necessary to satisfy the relationship F<W. It is preferable that the irradiation dose b is determined on the basis of irradiation dose data prepared in advance, corresponding to the correction amount or the relationship in which the correction amount is associated with the irradiation dose.

In the present embodiment, although the suction pressure of the suction unit 51 is not adjusted for reducing a frictional force, the wafer 11 is heated by the irradiation of light at the irradiation dose a, such that thermal deformation force does not exceed the maximum static frictional force. Consequently, the shape of the substrate-side pattern area 53 can be efficiently corrected, as in the first embodiment. The present embodiment can be combined with pressure adjustment in the first embodiment.

(Article Manufacturing Method)

A method of manufacturing a device (e.g., a semiconductor integrated circuit element, a liquid display element, or the like), as an article, may include a step of forming a pattern on a substrate (e.g., a wafer, a glass plate, a film-like substrate, or the like) using the imprint apparatus described above. Furthermore, the manufacturing method may include a step of etching the substrate on which a pattern has been formed. When other articles, such as a patterned medium (storage medium), an optical element, or the like, is manufactured, the manufacturing method may include other steps of processing the substrate on which a pattern has been formed, instead of the etching step. The article manufacturing method of the present embodiment has an advantage, as compared with a conventional article manufacturing method, in at least one of performance, quality, productivity, and production cost of an article.

While the embodiments of the present invention have been described with reference to exemplary embodiments, it is to be understood that the invention is not limited to the disclosed exemplary embodiments. The scope of the following claims is to be accorded the broadest interpretation, so as to encompass all such modifications and equivalent structures and functions.

We claim:

1. An imprint apparatus for forming a pattern of an imprint material on a substrate by using a mold, the imprint apparatus comprising;
    a substrate holding unit configured to hold the substrate by acting as a suction force between the substrate and a holding surface, the substrate holding unit including a first suction unit for sucking a rear surface of a first region of the substrate with a first suction force and a second suction unit for sucking a rear surface of a second region of the substrate, different from the first region of the substrate, with a second suction force;
    a deformation mechanism configured to deform a shape of the first region in a direction along the holding surface so as to reduce a difference between a shape of a pattern region of the mold and the shape of the first region of the substrate when forming the pattern of the imprint material on the first region; and
    an adjusting unit configured to adjust the first suction force and the second suction force, wherein the adjusting unit adjusts the first suction force to be less than the second suction force in at least a portion of a period during the deforming of the shape of the first region by the deformation mechanism.

2. The imprint apparatus according to claim 1, wherein the adjusting unit adjusts the first suction force to be less than the second suction force in at least the portion of the period by decreasing the first suction force to be less than a suction force between the substrate and the holding surface, when forming the pattern of the imprint material on a region of the substrate different from the first region.

3. The imprint apparatus according to claim 2, wherein, after the deforming of the shape of the first region into a predetermined shape by the deformation mechanism and prior to a releasing of the mold from the imprint material on the first region, the adjusting unit increases the first suction force.

4. The imprint apparatus according to claim 1, further comprising an acquiring unit configured to acquire the shape of the first region by detecting a plurality of marks provided on the substrate,
wherein the deformation mechanism deforms the shape of the first region so as to reduce a difference between a shape of a pattern formed on the mold and the shape of the first region.

5. The imprint apparatus according to claim 1, further comprising a curing unit configured to cure uncured resin on the first region by irradiating light,
wherein the deformation mechanism includes a heating mechanism configured to heat the first region by irradiating the first region with light having a wavelength that is different from the light used in curing the uncured resin.

6. The imprint apparatus according to claim 5, wherein the deformation mechanism causes an uneven temperature distribution in the first region by the irradiating light.

7. The imprint apparatus according to claim 4, further comprising a mold deformation mechanism configured to deform a shape of the mold, wherein the mold deformation mechanism deforms the shape of the mold, and the deformation mechanism deforms the shape of the first region, so as to reduce the difference.

8. The imprint apparatus according to claim 1, wherein, in at least the portion of the period, the adjusting unit decreases a friction force between the first suction unit and the substrate to be less than a friction force between the second suction unit and the substrate.

9. The imprint apparatus according to claim 1, wherein, in at least the portion of the period, a force to deform the first region by the deformation mechanism is greater than a maximum static friction force acting between the first suction force and the rear surface of the substrate.

10. A method of manufacturing an article, the method comprising steps of:
(a) forming a pattern of an imprint material on a substrate using an imprint apparatus for forming the pattern on the substrate by using a mold;
(b) processing the substrate on which the pattern is formed by the forming; and
(c) manufacturing the article from the processed substrate, wherein the imprint apparatus includes:
(i) a substrate holding unit configured to hold the substrate by acting as a suction force between the substrate and a holding surface, the substrate holding unit including a first suction unit for sucking a rear surface of a first region of the substrate with a first suction force and a second suction unit for sucking a rear surface of a second region of the substrate, different from the first region of the substrate, with a second suction force;
(ii) a deformation mechanism configured to deform a shape of the first region in a direction along the holding surface so as to reduce a difference between a shape of a pattern region of the mold and the shape of the first region of the substrate when forming the pattern of the imprint material on the first region, and
(iii) an adjusting unit configured to adjust the first suction force and the second suction force, wherein the adjusting unit adjusts the first suction force to be less than the second suction force in at least a portion of a period during the deforming of the shape of the first region by the deformation mechanism.

11. A method of manufacturing an article according to claim 10, further comprising adjusting, by the adjusting unit, the first suction force to be less than the second suction force in at least the portion of the period by decreasing the first suction force to be less than a suction force between the substrate and the holding surface, when forming the pattern of the imprint material on a region of the substrate different from the first region.

12. A method of manufacturing an article according to claim 11, wherein, after the deforming of the shape of the first region into a predetermined shape by the deformation mechanism and prior to a releasing of the mold from the imprint material on the first region, further comprising adjusting the first suction force by the adjusting unit.

13. A method of manufacturing an article according to claim 10, further comprising acquiring, by an acquiring unit, the shape of the first region by detecting a plurality of marks provided on the substrate,
wherein the deformation mechanism deforms the shape of the first region so as to reduce a difference between a shape of a pattern formed on the mold and the shape of the first region.

14. A method of manufacturing an article according to claim 10, wherein the imprint apparatus further includes a curing unit configured to cure uncured resin on the first region by irradiating light, and the deformation mechanism includes a heating mechanism configured to heat the first region by irradiating the first region with light having a wavelength that is different from the light used in curing the uncured resin.

15. A method of manufacturing an article according to claim 14, wherein the deformation mechanism causes an uneven temperature distribution in the first region by the irradiating light.

16. A method of manufacturing an article according to claim 13, further comprising deforming a shape of the mold, by a mold deformation mechanism, wherein the mold deformation mechanism deforms the shape of the mold and the deformation mechanism deforms the shape of the first region, so as to reduce the difference.

17. A method of manufacturing an article according to claim 10, wherein, in at least the portion of the period, further comprising adjusting, by the adjusting unit, a friction force between the first suction unit and the substrate to be less than a friction force between the second suction unit and the substrate.

18. A method of manufacturing an article according to claim 10, wherein, in at least the portion of the period, a force to deform the first region by the deformation mechanism is greater than a maximum static friction force acting between the first suction force and the rear surface of the substrate.

* * * * *